United States Patent [19]

Reibling et al.

[11] Patent Number: 5,319,737
[45] Date of Patent: Jun. 7, 1994

[54] NETWORK STRUCTURE FOR PATH GENERATION

[75] Inventors: Lyle A. Reibling, Grand Rapids; Michael D. Olinger, Kentwood, both of Mich.

[73] Assignee: Smiths Industries Aerospace & Defense Systems, Inc., Grand Rapids, Mich.

[21] Appl. No.: 890,381

[22] Filed: May 26, 1992

Related U.S. Application Data

[63] Continuation of Ser. No. 641,487, Jan. 15, 1991, abandoned.

[51] Int. Cl.$^5$ .............................................. G06F 15/46
[52] U.S. Cl. ..................................... 395/21; 395/22; 395/24
[58] Field of Search ............................. 395/21, 22, 24

[56] References Cited

U.S. PATENT DOCUMENTS

| | | | |
|---|---|---|---|
| 3,840,725 | 10/1974 | Grezdov et al. | 235/150.5 |
| 4,660,166 | 4/1987 | Hopfield | 364/807 |
| 4,719,591 | 1/1988 | Hopfield et al. | 364/807 |
| 4,937,872 | 6/1990 | Hopfield et al. | 381/43 |
| 5,016,188 | 5/1991 | Lan | 364/513 |
| 5,050,096 | 9/1991 | Seidman | 364/513 |
| 5,166,927 | 11/1992 | Iida et al. | 370/60 |

OTHER PUBLICATIONS

Tank et al., "Simple Neural Optimization Networks: An A/D Converter, Signal Decision Circuit, and a Linear Programming Circuit", IEEE Trans. Circuits and Systems, vol. CAS-33(5), May 1986, pp. 533–541.
Kennedy, et al., "Neural Networks for Nonlinear Programming", IEEE Trans. Circuits & Systems, vol. 35(5), May 1988, pp. 554–562.
Peterson et al., "A New Method for Mapping Optimization Problems onto Neural Networks," Intl. Jour. of Neural Systems, vol. 1(1) 1989, 3–22.

Primary Examiner—Michael R. Fleming
Assistant Examiner—Robert W. Downs
Attorney, Agent, or Firm—Varnum, Riddering, Schmidt & Howlett

[57] ABSTRACT

A network structure for path generation includes an operational amplifier circuit (200) implementation. The circuit (200) implements a finite difference approximation template for computing the weighted sum of its four "neighbors." The circuit implementation (200) includes a series of five output operational amplifiers (202, 204, 206, 208 and 210). Each of the output amplifiers includes a feedback path (212) having a feedback resistance, and is connected to the output terminal of its respective operational amplifier and to the negative input terminal (214) of the corresponding amplifier. The positive input terminal (216) of each of the output operational amplifiers is connected to a ground (218). The circuit implementation (200) further includes a series of input operational amplifiers (220, 222, 224, 226 and 228). The output terminals (230) of each of the input operational amplifiers are connected to respective ones of the input terminals (214) of the output operational amplifiers through input impedances. The input amplifiers include conductive feedback paths (232) having feedback resistances and connected to negative input terminals (234) of each of the input operational amplifiers. A positive input terminal (236) of each of the operational amplifiers is connected to a ground (238). Each of the negative input terminals (234) of each of the input operational amplifiers is connected to a series of four input impedances. Each of the input amplifiers includes reference voltage inputs.

4 Claims, 12 Drawing Sheets

```
1.      begin IMAGEINDEX (p,q,n,p',q')
2.      p' ← p;
3.      q' ← q;
4.      if p' > n then
5.          p' ← n - p' mod n;
6.      elseif p' < 1 then
7.          p' ← 2 - p';
8.      endif
9.      if q' > n then
10.         q' ← n - q' mod n;
11.     elseif q' < 1 then
12.         q' ← 2 - q';
13.     endif
14.     end IMAGEINDEX;
```

FIG. 7

NETWORK STRUCTURE FOR PATH GENERATION

This is a continuation of application Ser. No. 07/641,487, filed Jan. 15, 1991, now abandoned.

BACKGROUND OF THE INVENTION

1. Field of the Invention

The invention relates to computational architectures for parallel processing of signals and, more particularly, to massively parallel implementations of neural networks for path generation applications.

2. Description of Related Art

A number of practical problems in advanced technology require such a substantial amount of computations that real-time solutions are essentially unavailable from current technology. For example, one type of problem falling within this category relates to path planning in a multidimensional space. That is, in a large "problem space" (typically with several state variables) or "search space," it may be desired to search possible paths for a path having an optimal or "near optimal" performance measure through the space. The measure of performance is typically quantitatively expressed as a cost function associated with the selected path. In view of the relatively large search space, this type of path planning problem subjects computational resources to severe demands.

Solutions to problems such as path planning as described above are currently the subject of substantial research and development. In part, this research and development is directed to computer architectures for providing real time solutions to these problems. Although state-of-the-art digital computers are extremely powerful, such computers still exhibit certain limitations in problem solving. That is, many practical problems, such as real time path optimization, require such a substantial amount of computation that real time solutions were not earlier possible. Along with path optimization, pattern recognition problems are another category where computational requirements are substantially beyond state-of-the-art digital computers.

The development of real time solutions to problems such as path planning optimization and pattern recognition have led to substantial research and development associated with parallel processing of signals. For purposes of understanding the background of parallel computer structures, three configurations of parallel structures are described in Hwang and Briggs, *Computer Architecture and Parallel Processing*, McGraw-Hill 1984. These architectural configurations are typically characterized as pipeline computers, array processors and multiprocessor systems. In describing these types of architectural configurations, Hwang and Briggs also describe particular types of parallelism resulting from the configurations. For example, temporal parallelism results from pipeline computers as a result of the use of overlapped computations. Correspondingly, spatial parallelism results from multiple synchronized arithmetic logic units in array processors. Further, asynchronous parallelism is described within multiprocessor systems through the use of interactive processors having shared resources, such as memories, databases and the like.

With today's advanced state of the art in computer technology, parallel computers with $10^5$ to $10^6$ gates per chip facilitate the fabrication of massively parallel computers. Accordingly, a substantial amount of research has been directed to the understanding of the basic properties of highly parallel computation. For example, connectionist models (typically referred to as CM's) have resulted from the desire to understand computation in massively parallel architectures. In Fahlman and Hinton, "Connectionist Architectures for Artificial Intelligence," *Computer*, January 1987, the concept of research directed to the exploration of the use of massively parallel computer architectures is described as basically an attempt to avoid the conventional limitations of symbolic processing.

System response times for computers depend on the throughput, memory and interfacing capacities of the individual computer or computer network. In path planning applications, real time solutions are extremely difficult due to the massive computational throughput requirement associated with an extensive search space.

Extensive development has been performed with regard to parallelized versions of combinatorial search procedures. Other conventional search procedures, such as breadth-first, depth-first, alpha-beta, dynamic programming and the like, have been transformed into parallel versions. These parallelized search procedures are based on multiprocessor architectures comprising serial processors. Accordingly, this parallelizing has focused on data and control partitioning so as to address resource allocation of processors and memory only, rather than relatively unique parallel processing architectures.

As a result of the development associated with parallel processing, one type of technology which is considered to have a substantial potential with respect to such massively parallel architectures is neural networks. The development of neural network technology is often considered to have begun in 1943, and is described in McCulloch and Pitts, "A Logical Calculus of the Ideas Immanent in Nervous Activity," *Bulletin of Mathematical Biophysics*, Vol. 5, 1943, pp. 115-133. McCulloch and Pitts describe the use of the biological neuron as a computational model to compute boolean operations. Such a computing architecture is considered to be an alternative to the conventional Von Neumann architecture. A neural network is considered to be relatively distinct, in that the network can be programmed with data derived from its environment for purposes of adaptation instead of being conventionally programmed. Correspondingly, neural networks exhibit massive parallelism, with relatively high speed and inherent fault tolerance. Even animals with a relatively simple neural system structure can solve problems which would be difficult for solution by conventional digital computers.

Neural networks are essentially "motivated" by the biological neuron, an example of which is illustrated in FIG. 1. As shown in FIG. 1, a functional model of a simulated neuron comprises a series of synapses which act to provide outputs from other neurons and to provide inputs to the illustrated neuron. Inputs to the neuron from the synapses are typically characterized as dendrites. The "body" of the neuron, typically characterized as the soma, is functionally similar to a summer/threshold circuit. The output of the neuron, characterized as the axon, can be applied on axonal paths to the interconnection synapses.

Although neuronal computing elements may be relatively slow (on the order of $10^{-3}$ seconds), complex parallel connections of neuronal computing elements can result in relatively complex parallel processing having an overall "fast" throughput. Neurons with a computational speed of a few milliseconds can actually account for complex behavior in a few hundred milliseconds. Entire complex behaviors can be accomplished in a few hundred time steps of the computational system.

A physically realized neural network can comprise a highly parallel computational circuit having a series of amplifiers, with each of the amplifiers feeding back its output signal to itself and other amplifiers through a conductance $T_{ij}$. In one type of embodiment of a neural network, the $T_{ij}$ conductances (where $T_{ij}$ denotes the conductance between the output of amplifier j and the input of amplifier i) and the associated connections can be characterized as a connection network having one output signal set and two input signal sets.

The output signal set is applied to the amplifier inputs, one of the input signal sets is derived from the amplifier outputs, and the other input signal set is responsive to input stimuli applied to the neural network. As is known in the art, the values of the $T_{ij}$ conductances can be defined so as to achieve predetermined results, such as attaining different specified output states of the amplifiers in response to different ranges of input stimuli. As also known in the art, an input interconnection network may be interposed between the input stimuli and the second set of inputs of the feedback network. This input interconnection network, comprising a feedforward arrangement, converts the expected input signals to corresponding signals which drive the feedback network and amplifiers. The foregoing is merely one type of neural network, as described in Hopfield et al, U.S. Pat. No. 4,937,872 issued Jun. 26, 1990.

Neural networks exhibit various advantageous characteristics. Among these are the following:

1. Neural networks tend to be relatively resistant to hardware failures;
2. Pattern recognition occurs in a parallel mode;
3. Multiple layers in neural networks realize hierarchical data structures;
4. Some neural network structures exhibit properties of adaptive biological learning; and
5. Neural networks appear to be capable of capturing patterns in space, time, discrete and continuous representational models.

The connectionist model can be employed to describe a neural network. One of the fundamental concepts of connectionism as applied to neural networks is based on the premise that individual neurons do not transmit large amounts of symbolic information. Instead, a neural network provides computation by appropriate connections to relatively large numbers of similar computational elements. In a system employing connectionist parallel architecture, the "permanent" knowledge of the system is stored as patterns of connection-to-connection "strengths" among processing elements. In what is known as a "compact" connectionist model, the activity of a set of neurons tends to encode a concept group, instead of exactly one neuron accounting for any single individual concept. In what is known as a "diffuse" connectionist model, concepts are represented by a pattern of activity as a relatively larger set of neurons, which concurrently represent other concepts.

In further explanation, the connectionist model comprises a formalism of massively parallel models of computation. Such models are based upon information processing properties of neurons. As earlier mentioned, neurons are relatively slow as computing elements, but neuron networks have relatively complex parallel interconnections to other neurons. As also earlier mentioned, the processing characteristics of neurons can account for relatively complex behavior in a relatively few number of steps.

The contribution of the massive interconnection complexity can be characterized as a substrate for relatively more complex information processing capabilities. Accordingly, the connectionist model is based upon a theory that individual neurons do not exchange vast quantities of symbolic information, but instead perform computations by the complex interconnections between similar computationally simple units. Such interconnections allow for communication by means of spreading activation over weighted links among neurons.

For a connectionist model to be adaptable to physically realizable applications, the network of units requires a means for purposes of making decisions, or to perform some coherent action, as exemplified by animal and human behavior. Such a requirement implies that the networks must converge to stable states to effect decision making and coherent actions.

For purposes of providing additional background, the following paragraphs discuss various principles associated with particular search algorithms. Concepts associated with simulated annealing are described in Fahlman and Hinton, "Connectionist Architectures for Artificial Intelligence," *Computer*, January 1987. In this reference, Fahlman and Hinton describe the back propagation algorithm as a gradient descent search in a space of potential representational schemes.

For purposes of illustrating the "settling down" of a network during a back propagation search, it must be shown that a cost function exists which tends to decrease at each value change. In networks having symmetrically connected binary threshold units, a cost function typically characterized as the "energy" can be employed.

Each unit must determine the difference between the global energy of the network when the unit is disabled, and the global energy when the unit is enabled, given current states of other units. Such a difference is characterized as the "energy gap." If the energy gap is positive, the unit should be enabled or should remain enabled, so as to minimize the global energy. Otherwise, the unit should be disabled or should remain disabled.

A simulated annealing search, for purposes of escaping local minima, can be employed within an architecture which utilizes a particular type of network with hidden units. Simulated annealing escapes from high local minima by adding a random component to each unit's decision process. The gradient descent search step of simulated annealing is typically negative, but the step can be occasionally positive.

For purposes of a full understanding of the background of search algorithms, and although not necessarily required for an understanding of a processing structure in accordance with the invention, the following paragraphs describe concepts associated with dynamic programming. A more detailed analysis of the concepts associated with the same is set forth in Bellman, *Dynamic Programming*, Princeton University Press, 1957. In the aforedescribed reference, dynamic programming is introduced by describing a problem associated with multi-stage allocation processes. In such a process, the quantity x is expressed as two non-negative parts, y and $x-y$. In each stage of the process, the quantity y returns a value g(y) and the quantity $x-y$ returns a value $h(x-y)$. In accordance with the foregoing, total return for a single stage process is accomplished by maximizing the following function:

$$R_1(x, y) = g(x) + h(x - y) \quad \forall\ y \in [0, x] \quad \text{(Equation 1)}$$

The "price" to obtain the value g(x) is a reduction of y to ay. Correspondingly, to obtain the value h(x−y) the value x−y is reduced to b(x−y), with a greater than or equal to 0 and b less than 1. The function $f_n(x)$ is the "maximum" return obtained from an n-stage process starting with the initial quantity x, for x greater than or equal to 0. This function can be described as follows:

$$f_n(x) = \max_{\{y_1 y_i\}} R_N(x, y, \ldots y_{n-1}) \quad \text{(Equation 2)}$$

$$N = 2, 3, \ldots$$

For this first stage, namely $f_1(x)$, the function can be defined as follows:

$$f_1(x) = \max_{0 \leq y \leq x} [g(y) + h(x - y)] \quad \text{(Equation 3)}$$

For n stages, the function can be defined as a recursive function in accordance with the following:

$$f_n(x) = \max_{0 \leq y \leq x} [g(y) + h(x - y) + f_{N-1}(ay + b(x - y))] \quad \text{(Equation 4)}$$

Dynamic programming processes include several characteristic features. Specifically, the physical system for such a process is represented at any stage of the process by a relatively small set of parameters characterized as "state variables." At each stage of the process, a choice can be made from a number of possible decisions. The effects of the decision chosen at each stage of the process is a transformation of the state variables. Further, the past "history" of the system is unimportant with respect to determination of future actions. The purpose of the dynamic programming process is to maximize or minimize some "function" of the state variables.

For purposes of further description of concepts associated with dynamic programming, several known definitions are typically utilized. More specifically, a "policy" is typically defined as any rule for making decisions which result in allowable sequences of decisions. An "optimal" policy is typically characterized as the policy which maximizes or minimizes the pre-assigned function of the final state variables. In accordance with what is typically characterized as the "principle of optimality," an optimal policy comprises the property that regardless of the initial state and initial decision, remaining decisions must constitute an optimal policy with regard to the state resulting from the first decision.

Another conceptual arrangement is described in Dreyfus and Law, *The Art and Theory of Dynamic Programming*, Academic Press 1977. In this arrangement, the principle of optimality is defined as the best path from A to B having the property that, whatever is the initial decision at A, the remaining path to B, starting from the next point after A, must be the best path from that point to B. Further, the assignment of values to the various "subproblems" is characterized as the "optimal value function." In addition, the function which associates the best first decision with each subprogram is characterized as the "optimal policy function."

Returning again to neural network architecture, with the background associated with search algorithms as described in the foregoing paragraphs, computational methods based on neural networks are being developed for complex problems associated with learning, pattern classification/recognition and path planning.

Developments in artificial neural network approaches to constrained optimization problems, coupled with advances in integrated circuit technology, have resulted in advancement of developments associated with enhancing real-time control, decision-making and parameter compensation processes. Neural networks have been used in solving optimization problems expressed in the form of linear programming models, and functional optimization in the form of iterated descent. Neural computation can be characterized as being analogous to searching for a path which extends through a "valley" within an energy contour. Neural networks can further be characterized as computing by defining a computational energy function which has resulted from the optimization function.

Various known developmental projects have involved neural network models for purposes of solving constrained optimization problems. The results of these developments appear to indicate that properly designed neural networks can provide relatively rapid computations, with relatively "good" optima. Processing elements utilized in several of these developmental circuits or models comprise relatively simple analog neurons which are conducive to ultra-dense VLSI implementations. Detailed neural circuits for solving small linear programming problems constructed from non-linear operational amplifiers have also been described in the art.

The data elements of the mathematical model can be composed of vectors and matrices. The computations involve matrix-vector products and integrations repeated over a set of data. Such data-parallel computations can be executed relatively efficiently on a massively parallel machine. For purposes of achieving such speeds, a relatively good data-partitioning scheme is required, as well as a reduction of the communications.

Although not obvious from the prior art, the neural network architecture associated with the invention involves electric field theory. Accordingly, the following paragraphs briefly describe background principles of electric field theory pertinent to the invention.

The divergence of the current density $\bar{j}$ is defined as the charge (p) rate of change in accordance with the following:

$$\nabla \cdot \bar{j} = -\frac{\partial p}{\partial t} \quad \text{(Equation 5)}$$

In the steady state condition, no charge distribution changes occur, the charge rate of change is zero and, accordingly, the divergence of the current density $\bar{j}$ is zero.

The current density is defined in terms of the electric field $\bar{E}$ and the conductivity $\sigma$ in accordance with the following:

$$\bar{j} = \sigma \bar{E} \quad \text{(Equation 6)}$$

In the steady state condition, with the divergence of the current density being zero, Equation 5 can be written as follows:

$$\nabla \cdot (\sigma \bar{E}) = 0 \quad \text{(Equation 7)}$$

Using vector identity principles, Equation 7 can be written as:

$$\nabla \sigma \cdot \bar{E} + \sigma \nabla \cdot \bar{E} = 0 \quad \text{(Equation 8)}$$

The electric field $\bar{E}$ can also be defined as the negative gradient of the potential field $\phi$ as follows:

$$\bar{E} = -\nabla \phi \quad \text{(Equation 9)}$$

By substituting the negative gradient of the potential field $\phi$ in the vector identity principle Equation 8, Equation 8 can now be written as follows:

$$\nabla \sigma \cdot (-\nabla \phi) + \sigma \nabla \cdot (-\nabla \phi) = 0 \quad \text{(Equation 10)}$$

By dividing Equation 10 by the term $-\sigma$, the following expression is obtained for the electric field potential of a nonuniform conductive media:

$$\nabla^2 \phi + \frac{1}{\sigma} \nabla \sigma \cdot \nabla \phi = 0 \quad \text{(Equation 11)}$$

With the gradient and divergence operators of Equation 11 expanded in two dimensions, the following second order partial differential equation is obtained:

$$\frac{\partial^2 \phi}{\partial x^2} + \frac{\partial^2 \phi}{\partial y^2} + \frac{1}{\sigma} \frac{\partial \sigma}{\partial x} \frac{\partial \phi}{\partial x} + \frac{1}{\sigma} \frac{\partial \sigma}{\partial y} \frac{\partial \phi}{\partial y} = 0 \quad \text{(Equation 12)}$$

With x and y representing the two dimensions, Equation 12 can be defined in subscript notation as follows:

$$\phi_{xx} + \phi_{yy} + \frac{1}{\sigma} \sigma_x \phi_x + \frac{1}{\sigma} \sigma_y \phi_y = 0 \quad \text{(Equation 13)}$$

As earlier described, various network architectures have been developed for the general path planning problem and for the specific problem of finding optimal or near optimal paths among a multiple of paths. Although development is relatively extensive, the known network architectures directed to the path planning problem suffer from several disadvantages.

The Hopfield network has the advantage that its implementation as an analog circuit is relatively straight forward. However, one drawback to the Hopfield network is that the high gain limit is relatively difficult to physically implement. Another drawback associated with the network is that a globally optimal solution can only be obtained when the conductances are infinite, as shown in Maa and Shonblatt, "Stability of Linear Programming Neural Networks for Problems with Hybercube Flexible Region," *Proceedings of the 1990 International Joint Conference on Neural Networks*, June 1990.

Another disadvantage is associated with the potential difficulty in defining an appropriate energy function for the Hopfield network, where the energy function corresponds to the desired optimization problem. A further disadvantage is that some convergence states, comprising local minima, may represent infeasible solutions to the optimization problem. Still further, the network is highly sensitive to parameterization and initial conditions. These and other concepts associated with the Hopfield network are described in Wilson and Pauley, "On the Stability of the Travelling Salesman Problem Algorithm of Hopfield and Tank," *Biological Cybernetics*, Vol. 58, 1988, pgs. 63–70; Kahng, "Travelling Salesman Heuristics and Embedding Dimension in the Hopfield Model," *IEEE International Conference on Neural Networks*, 1989, Vol. 1, pgs. 513–520.

SUMMARY OF THE INVENTION

In accordance with the invention, a circuit is provided for implementing a five-point finite difference approximation numerical solution to a certain class of partial differential equations. The partial differential equations comprise a selected set of equation functional parameters A, B, C, D, E and F which substantiate a particular partial differential equation. The circuit includes an N plurality of gain-providing amplifiers comprising N/2 input amplifiers and N/2 output amplifiers, and where an output of one of said output amplifiers is connected to one input of each of N/2−1 input amplifiers, and an output of each of the others of said output amplifiers is connected to an input of the input amplifier associated with the one of said output amplifiers.

The circuit also includes conductance devices wherein the conductance value $w_i$ is related to the five-point finite difference approximation template coefficient corresponding to the functional parameters A, B, C, D, E and F.

BRIEF DESCRIPTION OF THE DRAWINGS

The invention will now be described with respect to the drawings, in which:

FIG. 7 is a sequence diagram comprising an illustrative embodiment in accordance with the invention for determining boundary conditions;

DESCRIPTION OF THE PREFERRED EMBODIMENTS

Figure 1:
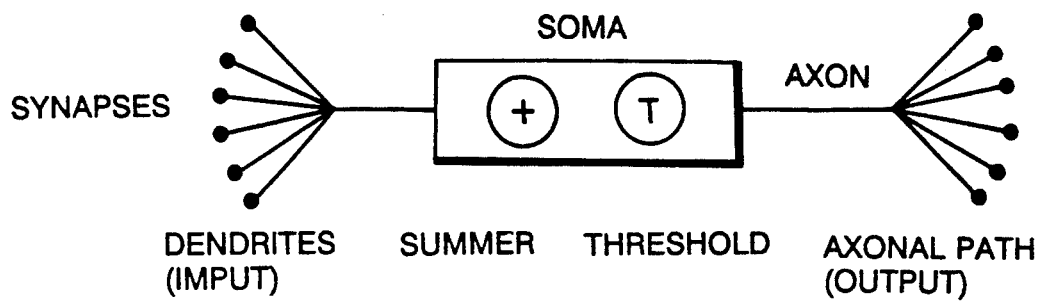
FIG. 1 is a prior art and known conventional representation of a neuron.

The principles of the invention are disclosed, by way of example, in a network architecture for implementing a neural network which provides a parallel search function for multiple paths. For purposes of understanding, the path planning problem which is the basis for a network architecture in accordance with the invention can be described as a problem in mathematical physics, although the architecture provides a physically realizable structure for problem solutions. An advantage in describing the path planning problem with principles of mathematical physics is that such principles embody a natural parallelism. Accordingly, the problem can further be defined as one of computational physics. That is, in accordance with such computational physics principles, state assignments essentially compute their "own" values through interactions with others.

The basis for generating a model of the path planning problem in a massively parallel network architecture is associated with principles of partial differential equations. As will be described in subsequent paragraphs herein, the network architecture, and the mathematical model providing a basis for this architecture, is directed to providing a description of the problem of finding the "best" path within a region comprising a variable cost function. Again, the description of this problem is best understood by describing the problem in accordance with principles of mathematical physics.

As will be described in greater detail herein, and in accordance with the invention, the description of the path planning problem, and the network architecture based thereon, can be directly related to the determination of current flow distribution through a nonuniform conducting media. Such a nonuniform conducting media can comprise, for example, a plate of inhomogeneous resistive material. In accordance with another aspect of the invention, another description of the path planning problem, and a basis for the network architecture associated therewith, can be defined as the problem of determining the propagation of wave fronts through a medium with a nonuniform refractive index.

As described herein, these path planning problems can be defined in accordance with mathematical physics principles and can be expressed as partial differential equations. In fact, the partial differential equation provides a natural parallelism in which the path planning problem can be viewed as one in accordance with principles of computational physics. In this regard, the variable cost function can be characterized as being analogous to the nonuniform conductivity of the plate media (in accordance with the architecture based on the nonuniform conducting media), or to the nonuniform refractive index (in accordance with the description of the path planning problem based on the medium having a nonuniform refractive index). As also described subsequently herein, the solution to the appropriate partial differential equation which provides the basis for the network architectures is a scalar potential field for the media. Appropriate paths can then be determined from the vector field, with the vector field being orthogonal to the equipotential contours of the field.

The computational definition of the massively parallel architecture can be characterized as based on numerical solutions to the partial differential equation. In accordance with the invention, a neural network architecture can then be defined which computes the scalar potential field solution to the partial differential equation, through the method of finite difference approximation. Approximation templates for the finite difference formula then define the architectural configurations.

With respect to a specific application of the path planning problem and the network architectures in accordance with the invention, the architectures can be applied to parallel search applications wherein it is desired to determine an optimal or near optimal aircraft trajectory in real-time on board a high performance aircraft. The purposes of such a trajectory generation can include increasing the probability of aircraft survivability and "effectiveness" of a mission by penetration of potential enemy threats and minimization of threat radar exposure. In accordance with the conventional path planning problem, optimization of an aircraft trajectory requires the searching over all possible paths in a multi-dimensional search base for the path with the smallest accumulated performance measure. This accumulated performance measure is characterized as representing the "total" threat exposure. This type of path planning problem, comprising a search over possible paths, clearly includes a substantial number of state variables in a relatively large space. Accordingly, computational resources are subjected to severe demands, and to date, real-time solutions for such aircraft trajectory problems have essentially been unavailable from current technology.

For purposes of describing the network architectures in accordance with the invention, neural network architectures must first be defined which compute the appropriate solution to the corresponding partial differential equation. The solution computation can employ the method of finite difference approximation. More specifically, reference is made to the following second order partial differential equation:

$$L(u) = A\frac{\partial^2 u}{\partial x^2} + B\frac{\partial^2 u}{\partial x \partial y} + C\frac{\partial^2 u}{\partial y^2} + \quad \text{(Equation 14)}$$

$$D\frac{\partial u}{\partial x} + E\frac{\partial u}{\partial y} + Fu = 0$$

The second order partial differential equation shown as Equation 14 can be approximated on a unit grid in accordance with the following:

$$L_1(u) \approx a_o u_p - \sum_{i=1}^{n} a_i u_{Q_i} \quad \text{(Equation 15)}$$

With reference to Equation 15, the n neighbors of P can be defined as $Q_1, \ldots Q_n$, where $Q_i$ is characterized as being equal to $(x+\xi_i, y+n_i)$. The Taylor series about the term $(P=(x, y))$ in two variables can be defined in accordance with the following equation:

$$f(x + ih, y + jk) = f(x, y) + ih\frac{\partial f(x, y)}{\partial x} + jk\frac{\partial f(x, y)}{\partial y} + \quad \text{(Equation 16)}$$

$$\frac{(ih)^2}{2}\frac{\partial^2 f(x, y)}{\partial x^2} + ijhk\frac{\partial^2 f(x, y)}{\partial x \partial y} + \frac{(jk)^2}{2}f(x, y) + \ldots$$

The neighborhood of P can be defined as the n points, i.e. an n+1 point approximation template. That is, $Q_i$ can be defined as being equal to $(x+\xi_i, y+n_i)$ for all $\xi_i$ and $n_i$ within the set I (where h is equal to k is equal to 1 for the unit grid). In accordance with the foregoing, the expansion of $u(x+\xi_i, y+n_i)$ about P can be defined in accordance with the following:

$$u(x|\epsilon_i, y|n_i) = u_{Q_i} = u(x, y)|_p + \epsilon_i \frac{\partial u}{\partial x}\bigg|_p + n_i \frac{\partial u}{\partial y}\bigg|_p + \frac{\epsilon_i^2}{2} \frac{\partial^2 u}{\partial x^2}\bigg|_p + \epsilon_i n_i \frac{\partial^2 u}{\partial x \partial y}\bigg|_p + \frac{n_i^2}{2} \frac{\partial^2 u}{\partial y^2}\bigg|_p + \cdots \quad \text{(Equation 17)}$$

The terms of Equation 17 can be substituted in Equation 15. With collection of common terms, Equation 15 can then be rewritten as follows:

$$L_f(u) = 0 = \frac{\partial^2 u}{\partial x^2}\bigg|_p \frac{1}{2} \sum_{i=1}^n a_i \epsilon_i^2 + \frac{\partial^2 u}{\partial x \partial y}\bigg|_p \sum_{i=1}^n a_i \epsilon_i n_i + \frac{\partial^2 u}{\partial y^2}\bigg|_p \frac{1}{2} \sum_{i=1}^n a_i n_i^2 + \frac{\partial u}{\partial x}\bigg|_p \sum_{i=1}^n a_i \epsilon_i + \frac{\partial u}{\partial y}\bigg|_p \sum_{i=1}^n a_i n_i + u_p \left( \sum_{i=1}^n a_i - a_o \right) \quad \text{(Equation 18)}$$

By substituting the coefficients of Equation 17 for those of Equation 14, a "system" of equations for the finite difference approximation can be defined as follows:

$$\sum_{i=1}^n a_i - a_o = F \quad \sum_{i=1}^n a_i n_i = E \quad \sum_{i=1}^n a_i \epsilon_i = D \quad \text{(Equation 19)}$$

$$\sum_{i=1}^n a_i n_i^2 = 2C \quad \sum_{i=1}^n a_i \epsilon_i n_i = B$$

$$\sum_{i=1}^n a_i \epsilon_i^2 = 2A$$

By solving for the $a_i$ coefficients of the system as defined by Equation 19, the value of a grid point can then be approximated by solution of Equation 15 for $u_p$ in accordance with the following:

$$u_p = \frac{1}{a_o} \sum_{i=1}^n a_i u_{Q_i} \quad \text{(Equation 20)}$$

As an example of this system and the solution therefor, with no mixed derivatives (i.e. B=0) for a five point formula (i.e. n=4), the solution can be described in accordance with the following:

$$a_o = 2A + 2C - F \quad \text{(Equation 21)}$$
$$a_1 = \frac{2A + D}{2}$$
$$a_2 = \frac{2C + E}{2}$$
$$a_3 = \frac{2A - D}{2}$$
$$a_4 = \frac{2C - E}{2}$$

Figure 2:
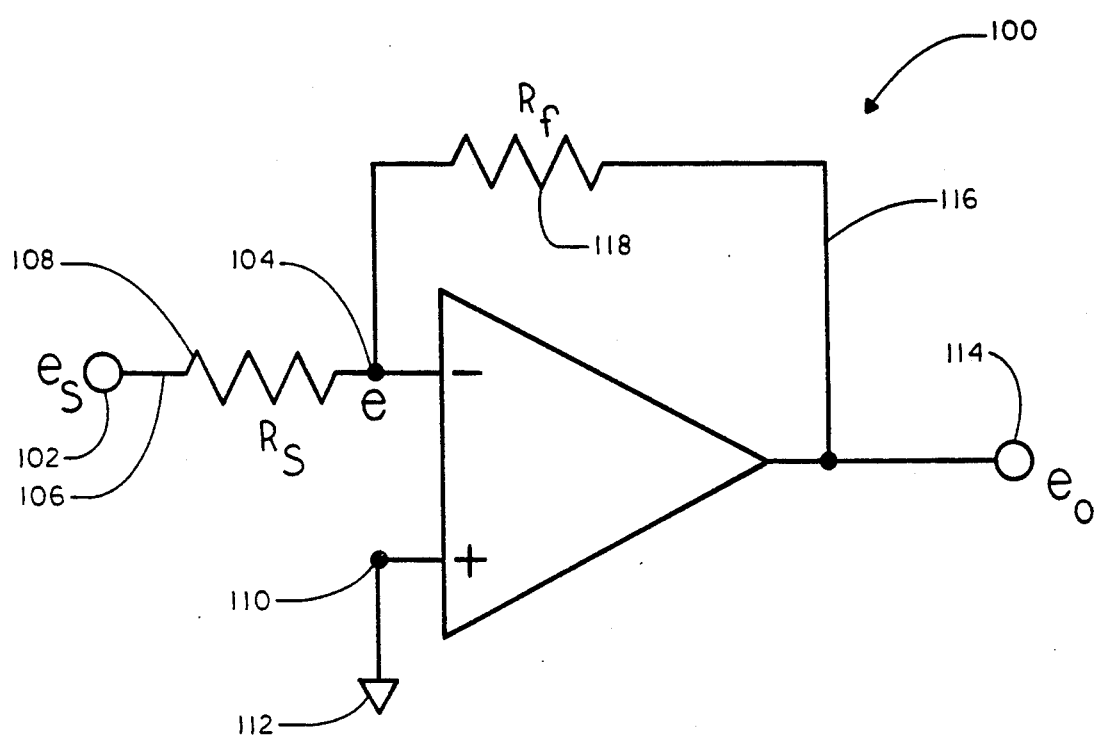
FIG. 2 is a diagram of an operational amplifier adapted for use in accordance with the invention.

For purposes of providing a network architecture and a circuit implementation in accordance with the invention and in accordance with the mathematical model, the basic element of the network can comprise a relatively conventional operational amplifier 100 as illustrated in FIG. 2. As shown in FIG. 2, the operational amplifier 100 includes a first input terminal 102 having a voltage thereon of $e_s$. The input terminal 102 is connected to the negative input terminal 104 through a path 106 having a resistance 108 with a value $R_s$. The voltage of the negative input terminal 104 is characterized as voltage e. Correspondingly, the operational amplifier 100 also includes a positive input terminal 110 connected to a ground 112. The output terminal of the operational amplifier 100 is characterized in FIG. 2 as terminal 114, having a voltage thereat of $e_o$. The output terminal 114 is connected back to the negative input terminal 104 through a conductive path 116 having a feedback resistance 118 with a value $R_f$.

In accordance with conventional circuit theory, the operational amplifier 100 attempts to match the voltage at each of its input terminals 104, 110. Accordingly, since the positive input terminal 110 is connected to ground 112, the output voltage $e_o$ at terminal 114 will be such that the voltage e at negative input terminal 104 will be driven to match the ground state through the feedback conductive path 116.

For determining the circuit equations defining the configuration of operational amplifier 100, Kirkoff's current law can be applied to the junction comprising the negative input terminal 104. With the assumption that a relatively high impedance is applied to the input of the operational amplifier 100, current flow to or from the negative input terminal 104 can essentially be ignored. Also, current flow to or from the operational amplifier 100 at its negative input can also be ignored. Accordingly, in accordance with Kirkoff's current law, the current flowing into terminal 104 through conductive paths 106 and 116 can be defined as follows:

$$\frac{e_s - e}{R_s} + \frac{e_o - e}{R_F} = 0 \quad \text{(Equation 22)}$$

Solving for the voltage e, Equation 22 can be rewritten as follows:

$$e = \frac{R_f}{R_f + R_s} e_s + \frac{R_s}{R_f + R_s} e_o \quad \text{(Equation 23)}$$

However, with the operational amplifier 100 driving its output so that its inputs match, and with the positive input terminal 110 being set to a ground state, the voltage e can be set to 0, and Equation 23 can be reduced as follows:

$$e_o = - \frac{R_f}{R_s} e_s \quad \text{(Equation 24)}$$

In accordance with the foregoing, the closed loop gain provided by the operational amplifier, defined as the ratio of voltage $e_o$ to voltage $e_s$, can be described as follows:

$$\text{GAIN} = \frac{e_o}{e_s} = - \frac{R_f}{R_s} \quad \text{(Equation 15)}$$

The foregoing description of the configuration operation of the operational amplifier 100 can be expanded to a multiple input configuration. In such an arrangement, for n inputs $e_1, \ldots e_n$, the operational amplifier configuration can be generalized to the following definition of the output voltage $e_o$:

$$e_o = -R_f \left( \frac{e_1}{R_1} + \frac{e_2}{R_2} + \ldots \frac{e_n}{R_n} \right) \quad \text{(Equation 26)}$$

Figure 3:
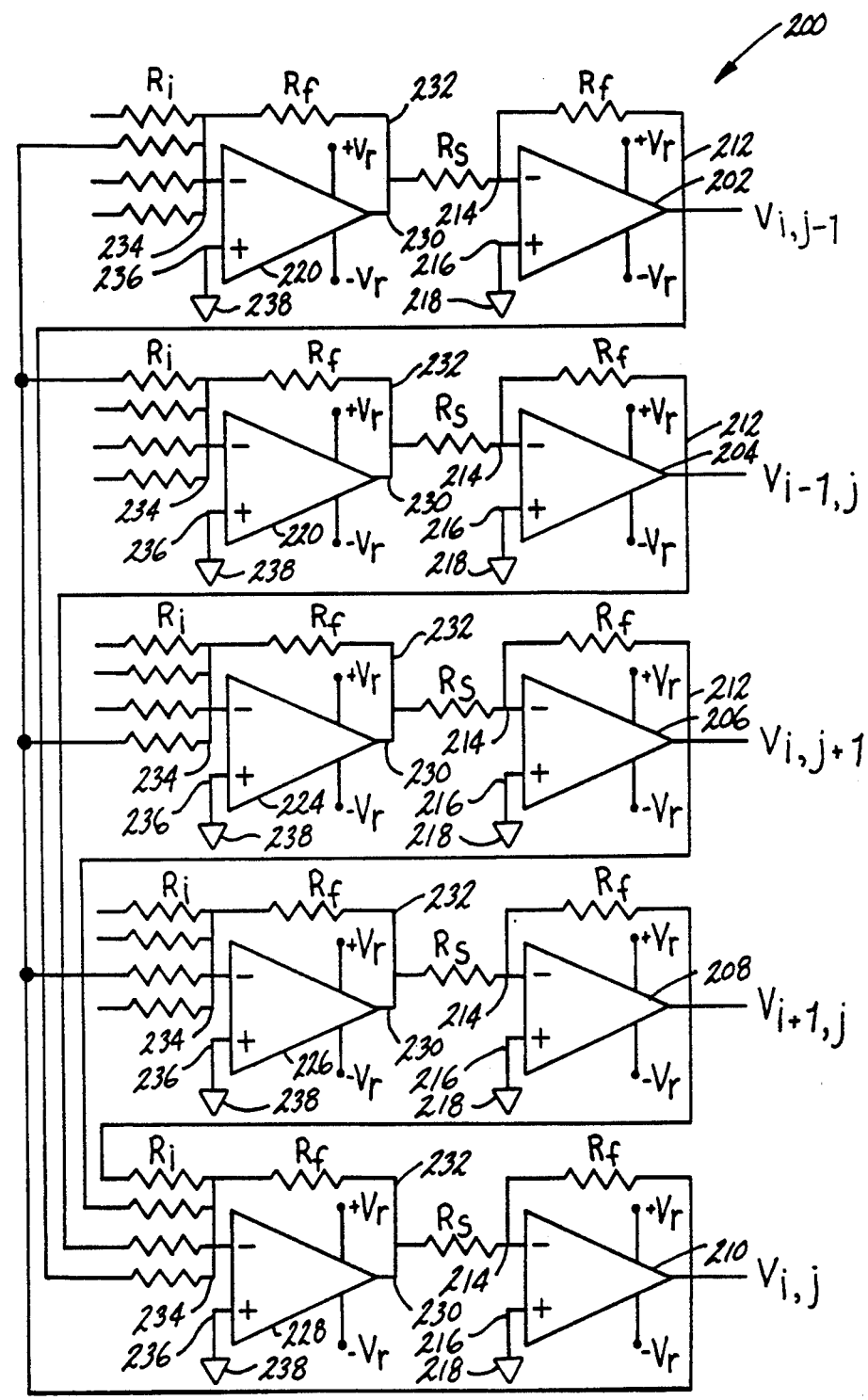
FIG. 3 is a circuit implementation of an element of the network structure in accordance with the invention.

In accordance with the invention, FIG. 3 illustrates an operational amplifier circuit implementation. The circuit implementation is shown in FIG. 3 as circuit 200, and is directed to implementation of a finite difference approximation template for computing the weighted sum of its four "neighbors." With reference to FIG. 3, circuit implementation 200 includes a series of five output operational amplifiers 202, 204, 206, 208 and 210. The output voltage of operational amplifier 202 is shown as voltage $V_{i,j-1}$. Correspondingly, the output voltage of amplifier 204 is shown as $V_{i-1,j}$, and the output voltage of amplifier 206 is shown as $V_{i,j+1}$. The output voltage of amplifier 208 is shown as $V_{i+1,j}$, and the output voltage of amplifier 210 is shown as $V_{i,j}$. Each of the output amplifiers 202-210 includes a feedback path 212 having a feedback resistance $R_f$. Each feedback path 212 is connected to the output terminal of its respective operational amplifier, and is also connected to the negative input terminal 214 of the corresponding amplifier. Correspondingly, the positive input terminal 216 of each of the operational amplifiers 202-210 is connected to a ground 218. Still further, each of the operational amplifiers 202-210 includes reference voltage signal inputs for reference voltages $+V_r$ and $-V_r$.

The circuit implementation 200 further includes a series of input operational amplifiers, illustrated in FIG. 3 as operational amplifiers 220, 222, 224, 226 and 228. The output terminals of each of the input operational amplifiers 220-228, identified in FIG. 3 as terminals 230, are connected to respective ones of the input terminals 214 of the output operational amplifiers 202-210 through input impedances $R_s$.

As with the output amplifiers 202-210, the input amplifiers 220-228 include conductive feedback paths 232 having feedback resistances $R_f$. The feedback paths 232 are further connected to negative input terminals 234 of each of the input operational amplifiers 220-228. A positive input terminal of each of the operational amplifiers 220-228, identified in FIG. 3 as terminal 236, is connected to a ground 238.

As further shown in FIG. 3, each of the negative input terminals 234 of each of the input operational amplifiers 220-228 is connected to a series of four input impedances identified in FIG. 3 as impedances $R_i$. Further, each of the input amplifiers 220-228 includes reference voltage inputs $+V_r$ and $-V_r$.

Figure 4:
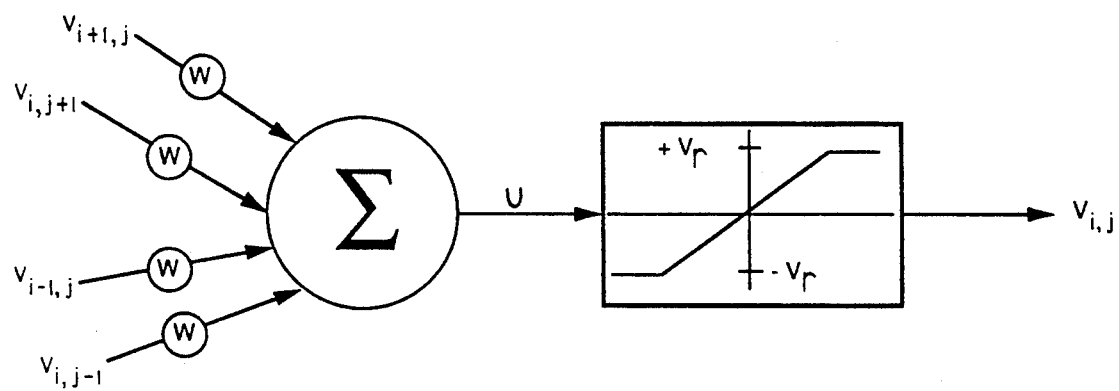
FIG. 4 is a functional representation of the circuit implementation illustrated in FIG. 3.

Further in accordance with the invention, the circuit implementation 200 includes an interconnection of certain outputs of the operational amplifiers 202-210 to certain of the inputs of each of the operational amplifiers 220-228. Specifically, the output $V_{i,j}$ of amplifier 210 is fed back as an input to the negative input terminal 234 through impedance $R_i$ of each of the input operational amplifiers 220-226. Each of the outputs $V_{i,j-1}$ of amplifier 202, $V_{i,1,j}$ of amplifier 204, $V_{i,j+1}$ of amplifier 206 and $V_{i+1,j}$ of amplifier 208 are fed back as inputs to negative input terminal 234 through impedance $R_i$ of operational amplifier 228, which comprises the structure that implements the five-point finite difference approximation solution. It is this structure which forms the basis for networks constructed in accordance with the invention. With respect to the foregoing description of the circuit implementation 200 in accordance with the invention as illustrated in FIG. 3, FIG. 4 functionally illustrates the operational amplifier interconnections. Specifically, FIG. 4 illustrates that an input to the operational amplifier network elements can be defined as an input u, comprising the sum of weighted inputs from other network elements. The output, shown as $V_{i,j}$, can vary between the reference voltages $+V_r$ and $-V_r$. For purposes of providing the neural network architecture employing operational amplifiers, a conductance G must be determined for each of the input connections to the input operational amplifiers 220-228 of the circuit implementation 200 shown in FIG. 3. This conductance G can be defined as the inverse of R. Accordingly, the procedure for implementation of the network architecture would first include setting of a reference conductance $G_f$. Thereafter, for each of the input connection weights $w_i$ from the approximation template neuron $Q_i$, the corresponding conductance value $G_i$ must be determined. The corresponding conductance value $G_i$ can be defined as being equal to $G_f w_i$, where $w_i = \alpha_i/\alpha_o$ as defined in Equation 21.

In accordance with the foregoing, and in accordance with the invention, a neural network architecture can be defined for the path planning problem of "finding" multiple paths. The mathematical model forming the basis for this network architecture employs the concept that the problem of finding the "best" path for a region having a variable cost function is substantially similar to the finding of maximum current flow through a nonuniform conducting media, such as a plate of inhomogeneous resistant material. The variable cost function can be characterized as analogous to the nonuniform conductivity of the plate media. As described in subsequent paragraphs, the boundary conditions for the source potential and sink potential can be characterized as analogous to the start and goal nodes of the network architecture, respectively.

With the numerical solution of the finite difference approximation to the appropriate partial differential equation describing the scalar electric field potential in the media, the current flow can be determined as a vector field. In addition to the source and sink values included as boundary conditions as previously described, it is also necessary to establish boundary conditions along the edge of the grid. That is, it is desired that no solution path extends over the grid. Accordingly, it is preferable that near the edge of the grid, each path approaches a parallel course asymptotically to the edge.

As previously described, the mathematical model for a network architecture in accordance with the invention can be based on electric field theory. Principles associated with the electric field theory have previously been described in the section entitled "Background of the Invention." From the conventional definition for current density and its divergence in steady state conditions, the electric field potential ($\phi = \phi (x_1, x_2, \ldots, x_n)$) of a nonuniform conductive media can be derived in accordance with the following:

$$\nabla^2 \phi + \frac{1}{\sigma} \nabla \sigma \cdot \nabla \phi = 0 \quad \text{(Equation 27)}$$

The value $\sigma$ ($\sigma = \sigma (x_1, x_2, \ldots x_n)$) is characterized as the nonuniform conductivity of the media. The cost function is employed to model the resistivity (or inversely the conductivity) $\sigma$ of the conducting media. For two dimensions, and expanding the gradient and divergence operators of Equation 27, the following second order partial differential equation is obtained:

$$\phi_{xx} + \phi_{yy} + \frac{1}{\sigma} \phi_x \sigma_x + \frac{1}{\sigma} \sigma_y \phi_y = 0 \qquad \text{(Equation 28)}$$

The electric field and current density are conservative fields, since they result from the gradient of a scalar field. Correspondingly, the field lines emanate from source charges and terminate on sink charges. In accordance with the invention, these field lines represent the solution to the search problem as multiple paths.

Several features of the multiple paths should be noted. First, every heading from a start node has a defined path, due to the continuous vector field emanating from the source. Further, each location having non-zero conductivity includes a path defined through the location, also in view of the continuous vector field emanating from the source. Finally, the model as described above supports both zero and "infinite" cost function regions.

With respect to boundary conditions, it is possible to employ image principles, whereby the path planning problem is reflected about a boundary having the following condition:

$$\frac{\partial f}{\partial x_i} = 0 \qquad \text{(Equation 29)}$$

In view of the path planning problem having an identical image, the boundary condition is therefore maintained. Since it is desired to maintain the flux lines asymptotically parallel at the edge of the problem grid, it is necessary to establish equipotential contours normal to the grid edges. This arrangement can be accomplished by setting the following boundary conditions:

$$\left.\frac{\partial \phi}{\partial y}\right|_{(y = y_{min}, y = y_{max})} = 0 \qquad \text{(Equation 30)}$$

$$\left.\frac{\partial \phi}{\partial x}\right|_{(x = x_{min}, x = x_{max})} = 0$$

The first boundary condition shown above will cause the flux lines $\overline{E}$ to be parallel to the unit vector x, since there will be no y component of the potential gradient established along the top and bottom edges of the grid. Correspondingly, the second boundary condition shown in Equation 30 will provide parallel solutions of $\overline{E}$ along the left and right edges of the grid, since there will be no x component of the potential gradient thereat. Further, the equipotential contour lines will be normal to the edge of the grid.

With reference to the circuit implementation of the finite difference approximation as previously described, and with reference to Equation 14, the following quantities $C_x$ and $C_y$ can be defined:

$$C_x = \sigma_x/\sigma \quad C_y = \sigma_y/\sigma \qquad \text{(Equation 31)}$$

With the quantities $C_x$ and $C_y$ defined as above Equation 14 can be rewritten as follows:

$$L_1(\phi) = \frac{\partial^2 \phi}{\partial x^2} + \frac{\partial^2 \phi}{\partial y^2} + C_x \frac{\partial \phi}{\partial x} + C_y \frac{\partial \phi}{\partial y} = 0 \qquad \text{(Equation 32)}$$

with the coefficients A=1, B=0, C=1, D=$C_x$, E=$C_y$ and F=0. As previously described, it is desired to derive a five-point finite difference formula. Coefficients for this difference formula can be expressed as follows:

TABLE 1

| i | $\epsilon$ | $n_i$ |
|---|---|---|
| 1 | 1 | 0 |
| 2 | 0 | 1 |
| 3 | 1 | 0 |
| 4 | 0 | 1 |

If the coefficient values shown above are substituted into the system previously defined and described with respect to Equation 19, the following values are derived:

$$a_1 + a_2 + a_3 + a_4 = a_o$$

$$a_2 - a_4 = C_y$$

$$a_1 - a_3 = C_x$$

$$a_2 + a_4 = 2$$

$$a_1 + a_3 = 2 \qquad \text{(Equation 33)}$$

The solutions to the set of equations defined as Equation 33 are as follows:

$$a_1 = 1 + \frac{C_x}{2} \qquad \text{(Equation 34)}$$

$$a_2 = 1 + \frac{C_y}{2}$$

$$a_3 = 1 - \frac{C_x}{2}$$

$$a_4 = 1 - \frac{C_y}{2}$$

$$a_o = 4$$

If the Equations 34 are substituted into the approximation equation shown as Equation 25, a solution for $U_p$ provides the following finite difference approximation:

$$U_p = \frac{1}{4}\left[\left(1 + \frac{C_x}{2}\right)V_{Q1} + \left(1 + \frac{C_y}{2}\right)V_{Q2} + \left(1 - \frac{C_x}{2}\right)V_{Q3} + \left(1 - \frac{C_y}{2}\right)V_{Q4}\right] \qquad \text{(Equation 35)}$$

Figure 5:
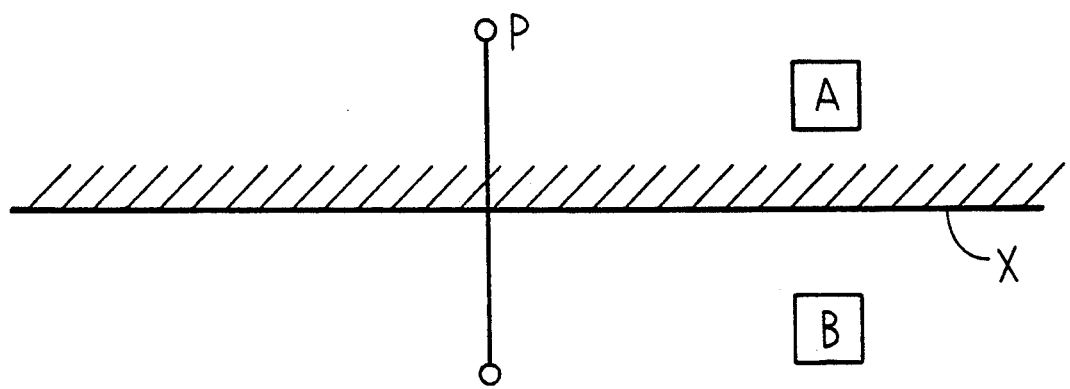
FIG. 5 is a functional representation illustrating an image arrangement associated with a boundary.

The following paragraphs briefly describe concepts associated with the template definition for the boundary conditions. FIG. 5 illustrates a half-plane A and a half-plane B forming a boundary C. The point P represents a point charge. The half-plane A can be solved, by reflecting the half-plane A into B, and reflecting the point charge P. In this manner, the entire plane is solved, as a dipole charge results in maintaining the following boundary conditions along the reflection line x:

$$\frac{\partial f}{\partial y} = D \qquad \text{(Equation 36)}$$

Figure 6:
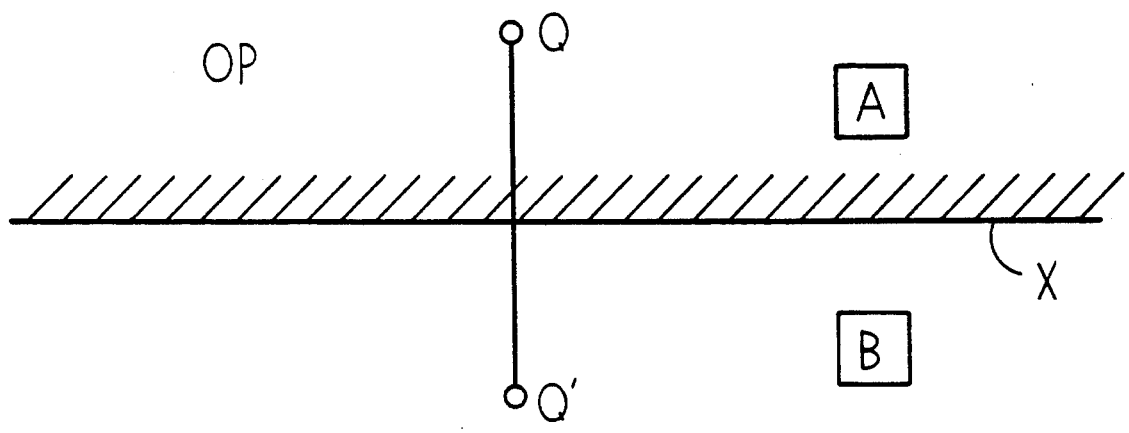
FIG. 6 is a further representation of an image arrangement associated with the boundary.

In accordance with the foregoing, the boundary region approximations will result in reflecting back into the original region. FIG. 6 represents the more generalized arrangement, and illustrates the point charge P separate from an image point Q. It is possible to approximate for the point charge P utilizing Q' in the image problem by reflecting into Q and utilizing this point instead of P. If the row or column index for a template coordinate occurs outside of the coordinates of the grid, it is necessary to map the index back into the problem space. If the index k is greater than n, then it is necessary to compute k mod n to reflect the index back into the problem. If the index k is less than 1, it is necessary to compute 2 mod k to reflect the index back into the problem. A functional software solution for mapping the image index is illustrated in FIG. 7.

An exemplary application of this mapping can be shown employing the five point approximation for a nonuniform media. More specifically, the approximation at the y=n border can be characterized as follows:

$$\phi_{i,n} = \frac{1}{4}\left[\left(1 + \frac{C_x}{2}\right)\phi_{i+1,n} + \left(1 - \frac{C_x}{2}\right)\phi_{i-1,n} + \left(1 + \frac{C_y}{2}\right)\phi_{i,n+1} + \left(1 - \frac{C_y}{2}\right)\phi_{i,n-1}\right] \qquad \text{(Equation 37)}$$

However, by definition, the following condition is maintained:

$$\left.\frac{\partial \phi}{\partial y}\right|_{i,n} = 0 = \frac{\phi_{i,n+1} - \phi_{i,n-1}}{2} \qquad \text{(Equation 38)}$$

In accordance with Equation 38, the following equality must also be maintained:

$$\phi_{i,n+1} = \phi_{i,n-1} \qquad \text{(Equation 39)}$$

The equality shown in Equation 39 represents the expected image mapping. With this equality substituted into Equation 37, the following result is achieved:

$$\phi_{i,n} = \frac{1}{4}\left[\left(1 + \frac{C_x}{2}\right)\phi_{i+1,n} + \left(1 - \frac{C_x}{2}\right)\phi_{i-1,n} + 2\phi_{i,n-1}\right] \qquad \text{(Equation 40)}$$

The flux lines for the electrostatic model are utilized as the path definitions. These flux lines must be computed when the electrostatic potential field is derived for the problem, from the solution to the partial differential equation. As apparent from the foregoing, there are an infinite number of flux lines which leave the source point and enter the sink point, since the source and sink points are singularities in the potential field solution. At every point in the potential field, a gradient vector (i.e. the electric field vector) exists, with the exception of the two singularities. From the source point, an angle is selected from which to "trace out" the flux line. This angle will represent the initial heading at the start node (i.e. the source point). With employment of a small incremental path step, a progression is made along this heading by the magnitude of the path increment. Thereafter, a gradient vector can be determined, which will define the direction of the path descent over the potential field surface. In this manner, the path is obtained as a flux line. However, because a numerical solution to the potential field is obtained only at the grid points, it is necessary to interpolate the solution to the potential field during the gradient descent.

Figure 8:
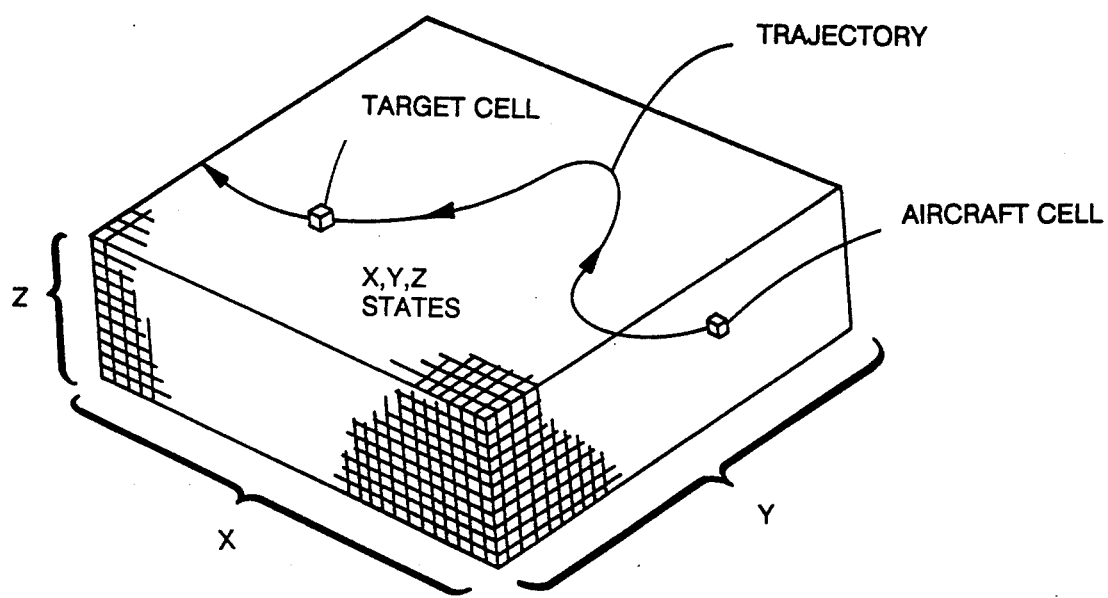
FIG. 8 is a grid representation of an aircraft trajectory optimization problem for which a network structure in accordance with the invention may be employed.

As previously described in part, a particular application for path planning is optimization of aircraft trajectory. Such an optimization by path planning involves searching through a multidimensional search space for a particular path having an optimal or near optimal performance measure through the search space. FIG. 8 represents such a trajectory optimization through a three dimensional search space. The quantitative measure of performance can be expressed as a probability of survival $P_s$ along the trajectory. This performance measure attempts to capture a numerical representation of the probability of successfully completing the mission, and the probability of surviving the mission. Successful completion requires that all time constraints are met and that fuel consumption does not exceed capacity. Survival requires that during mission execution, the aircraft is not destroyed or incapacitated by the operation of aircraft threats. Such requirements are met by finding a trajectory through the "threat" region for which the performance measure is maximized.

Rather than maximizing the probability of survival performance measures, the aircraft trajectory optimization problem can be converted to one of minimizing of a performance measure comprising a function of the negative logarithm of the probability of survival in accordance with the foregoing:

$$D = F(-\log P_s) \qquad \text{(Equation 41)}$$

where D represents a "danger metric" based upon survivability in a dense threat environment, taking into account threat locations, aircraft exposure due to altitude, masking effects of terrain; etc. This danger metric is essentially utilized as the cost function for the search, by assigning a danger value to each state.

In accordance with the invention, the solution to the aircraft trajectory optimization problem can be performed by construction of a neural network model as previously described herein, and employed to perform a parallel computation of the scalar potential field at each spatial point. The architecture of the neural network model must therefore solve an elliptic partial differential equation. As previously described, finite differences can be employed to solve the potential field equation, and the five point approximation formula described herein can be employed in accordance with the invention. For the neural network implementation, the neuron input function, defined as $U_p$, can be determined in accordance with Equation 35. The synaptic weights implement the nonuniformity of the cost functions.

A portion of the neural network to solve the Laplacian partial differential equation for the nonlinear neuron output function was illustrated in FIG. 3, and previously described herein. FIG. 3 specifically shows the network architecture employing an operational amplifier implementation. An entire search space for the aircraft trajectory optimization problem, or for any similar type of optimization problem, can be constructed by replicating the portion of the neural network shown in FIG. 3 over the entire grid array of the search space. The output of the source and sink neurons corresponding to the start and goal nodes are clamped to the reference voltages. More specifically, the output of the source neuron corresponding to the start node is clamped to $+V_r$. The output of the sink neuron corresponding to the goal node is clamped to $-V_r$. With the clamping of the source and sink to the maximum and minimum, respectively, of the potential value occurring on the boundary of the problem, the clamped values can be employed as the limits of the neuron output function, since all potential values inside the boundary of the problem will lie between these limits.

Figure 9:
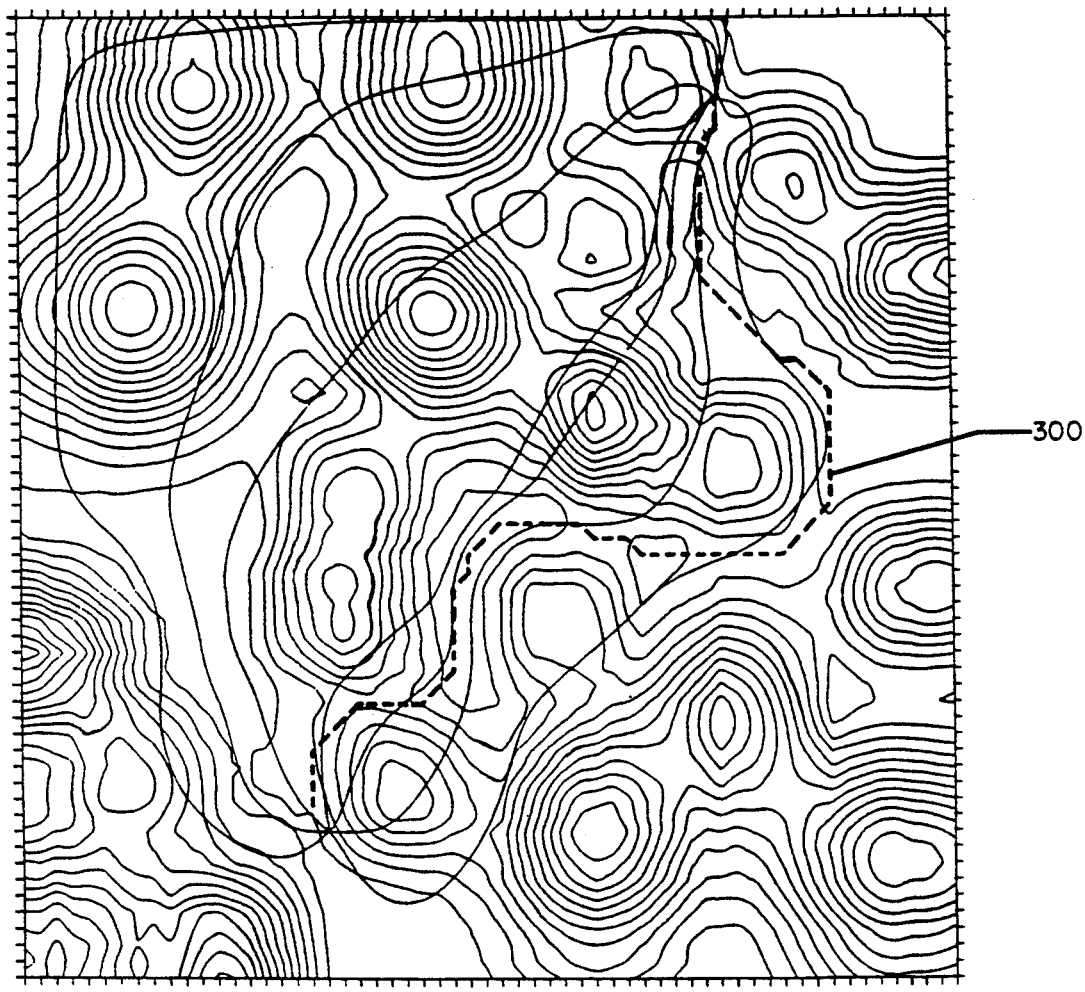
FIG. 9 is an illustration of the solution to a path optimization problem performed with a network structure in accordance with the invention.

FIG. 9 illustrates results of a physically realized system in accordance with the invention. The cost function is shown in FIG. 9 as the contour lines. The dashed curved, identified as curve 300, represents the reference optimal path computed using a "best-first" search. The remaining curves illustrated in FIG. 9 connecting the start node to the goal node are field lines derived from the gradient descent on the potential field determined by the neural network architecture. As shown in FIG. 9, the field lines have a relatively reasonable location about the reference path. The reference path is entirely contained within a region bounded by a pair of field lines. Several portions of the reference path are closely approximated by the field lines.

The example illustrated in FIG. 9 was determined employing a five point approximation. Accordingly, each neuron implementation comprised inputs from its four nearest neighbors. In the experimental physically realized system, the network for the plot illustrated in FIG. 9 included 3,600 neurons.

The foregoing generally describes the concepts in accordance with the invention whereby the "best" path through a region having a variable cost function comprises a path planning problem similar to determination of current flow through a nonuniform conducting media. In accordance with another aspect of the invention, the concept of determining current flow through a nonuniform conducting media can be substituted with the concept of determining propagation of wave fronts through a medium having a nonuniform refractive index. A substantial amount of knowledge currently exists in the art with respect to construction of models directed to wave propagation phenomena. These models relate to various quantities which can be employed to incorporate the concept of a cost function as previously described, such as velocity, refractive index and the like. Certain of the basis for this art relates back to Fermat's "Principle of Least Time" for the propagation of light through material having a varying refractive index. In part, this art is also related to the Hamilton-Jacobi "Principle of Least Action," from the theory of mechanics of the calculus of variations, and optimal paths.

For purposes of description, the wave equation can be described as a condition of a physical quantity, $\Psi$, satisfying the following equation:

$$V^2 \nabla^2 \psi = -\frac{\partial^2 \psi}{\partial t^2} = D \quad \text{(Equation 42)}$$

In Equation 42, V is defined as the phase velocity of the wave, and may generally comprise a function of the space coordinates (i.e. a wave travelling in a nonhomogenous medium).

It is desired to develop an expression for the wave equation in which a solution is determined as a function of only the spatial coordinates of the medium. For this purpose, periodic solutions of the wave equation can be determined in accordance with the following:

$$\nabla^2 \psi = \frac{1}{V^2} \frac{\partial^2 \psi}{\partial t^2} \quad \text{(Equation 43)}$$

Initially, the value $\Psi$ can be set so as to be equal to $\Psi_c S$, where $\Psi_c$ is dependent only upon the spatial coordinates and S is solely a function of time. For example, S can be defined in accordance with the following:

$$S = e^{2\pi i f(t-t_0)} \quad \text{(Equation 44)}$$

From the foregoing, the following equations can also be defined:

$$e^{2\pi i f(t-t_0)} \nabla^2 \psi_c = \frac{\psi_c}{V^2} \frac{\partial^2 S}{\partial t^2} \quad \text{(Equation 45)}$$

$$\frac{\partial S}{\partial t} = 2\pi i f e^{2\pi i f(t-t_0)}$$

$$\frac{\partial^2 S}{\partial t^2} = -4\pi^2 f^2 e^{2\pi i f(t-t_0)}$$

By substitution of the third of the Equation 45 into the first of the same, the following is obtained:

$$\nabla^2 \psi_c = -\frac{4\pi^2 f^2}{V^2} \psi_c \quad \text{(Equation 46)}$$

$$\nabla^2 \psi + K^2 \psi = 0$$

$$K = \frac{2\pi f}{v} = \frac{w}{v}$$

By definition, the wave front velocity v can be defined as follows:

$$\lambda f = v \quad \text{(Equation 47)}$$

The velocity v can be characterized as being analogous to the inverse of the cost function. Accordingly, the higher the cost function, the slower the propagation velocity. With the cost function defined as C, the relationship can be defined as follows:

$$v \approx \frac{1}{C} \quad \text{(Equation 48)}$$

With the highest velocity being defined as c, the fastest propagation in a vacuum, this velocity can be related to the minimum cost function in accordance with the following:

$$v_{max} = c \approx \frac{1}{C_{min}} \quad \text{(Equation 49)}$$

For a constant frequency, f, the slower the propagation velocity v, the smaller will be the wavelength $\lambda$. Since it is desired that the wave propagation velocity is inversely related to the cost function C, the following equations can be written:

$$v = \frac{1}{C}$$ (Equation 50)

$$V_{max} = \frac{1}{C_{min}}$$

$$V_{min} = \frac{1}{C_{max}}$$

$$v = \lambda f$$

In accordance with the foregoing, for a given frequency f, the following equations can be defined:

$$\lambda_{max} = \frac{V_{max}}{f} = \frac{1}{fC_{min}}$$ (Equation 51)

$$\lambda_{min} = \frac{V_{min}}{f} = \frac{1}{fC_{max}}$$

For purposes of defining the wave equation parameter K, the spatial sampling frequency, or minimum wavelength, can be established based upon the grid spacing for the problem.

In accordance with the foregoing, N can be defined as the number of grid points per period for the maximum frequency. With $\Delta$ being defined as the spacing between the grid points of the problem, the minimum wavelength, defined as $N\Delta$, is the smallest wavelength at the highest cost to ensure that at least N sample points are within a single period of a wave form. In accordance with the foregoing, a frequency $f_o$ can be defined as the fundamental (i.e. maximum) frequency. The desired scaled frequency for the cost function C can then be defined as follows:

$$f = \frac{C}{C_{max}} f_o$$ (Equation 52)

For the maximum of the cost function, the frequency defined by Equation 52 will be the fundamental frequency. Accordingly, the value of K can be derived in accordance with the following:

$$K = 2\pi f = 2\pi f_o \frac{C}{C_{max}} = \frac{2\pi C}{C_{max} \lambda_{min}} = \frac{2\pi C}{C_{max} N\Delta}$$ (Equation 53)

With the foregoing, a circuit implementation of the finite difference approximation can be obtained with respect to the wave equation. The wave equation can be written in accordance with the following:

$$L_1(\psi) = \frac{\partial^2 \psi}{\partial x^2} + \frac{\partial^2 \psi}{\partial y^2} + K^2 \psi = 0$$ (Equation 54)

In accordance with the foregoing, the coefficients of Equation 14 can be defined as A=1, B=0, C=1, D=0, E=0 and F=$K^2$. As derived with respect to the electric field equation, it is desired to obtain a five-point finite difference formula. The coefficients will be as earlier described with respect to the electric field equation. Substituting these coefficients into the system described by Equations 48 provides the following:

$$\alpha_1+\alpha_2+\alpha_3+\alpha_4-\alpha_0 K^2$$

$$\alpha_2-\alpha_4=0 \quad \alpha_2+\alpha_4=2$$

$$\alpha_1-\alpha_3=0 \quad \alpha_1+\alpha_3=2$$ (Equation 55)

The solutions to the Equations 55 will be as follows:

$$\alpha_1=1 \quad \alpha_2=1$$

$$\alpha_3=1 \quad \alpha_4=1$$

$$\alpha_0=4-K^2$$ (Equation 56)

Substitution of the Equations 56 into Equation 25, and solving for $U_p$ provides the following finite difference formula:

$$V_p = \frac{1}{4-K^2}[V_{Q1} + V_{Q2} + V_{Q3} + V_{Q4}]$$ (Equation 57)

In accordance with the foregoing, the path planning problem with respect to determination of the cost function is shown to be analogous to determining propagation of wave fronts through a medium having a nonuniform refractive index. The network architecture to implement the structure defined by Equation 57 will be in accordance with the architecture shown in FIG. 3.

Figure 10:
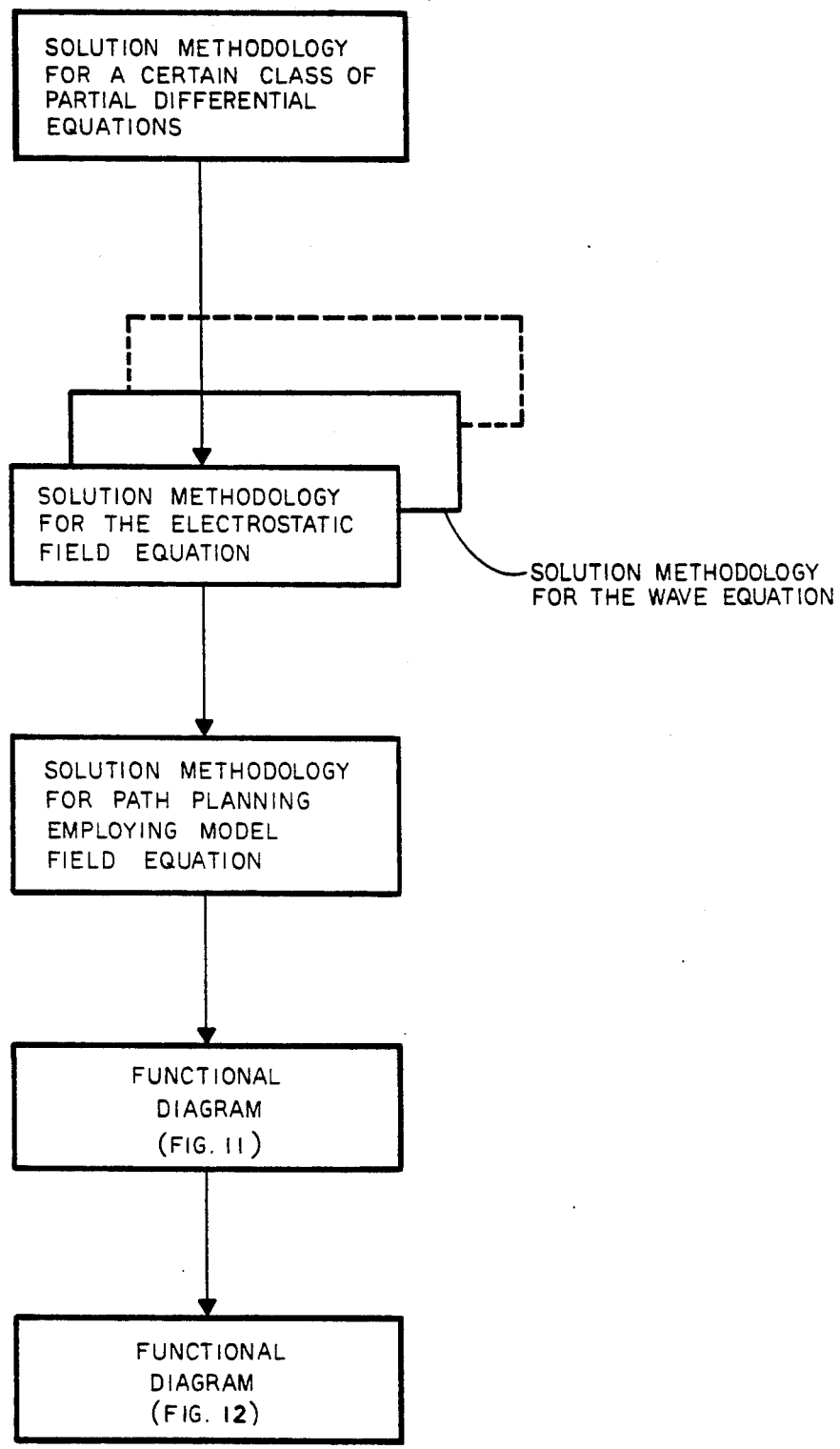
FIG. 10 is a sequence diagram illustrating functional sequence associated with the development of a circuit structure in accordance with the invention.

The implementation procedure for a network architecture in accordance with the invention can be summarized in accordance with the functional block diagram of FIG. 10. As shown therein, a solution methodology has first been determined for a particular class of partial differential equations. As described herein, the particular solution methodology of embodiments in accordance with the invention have comprised finite difference approximations.

Following determination of this methodology, a solution methodology can be determined for the electrostatic field equation or, alternatively, for the wave equation, as also previously described herein. With a methodology determined for the electrostatic field equation, a methodology can then be determined for path planning, employing the model field equation.

Figure 11:
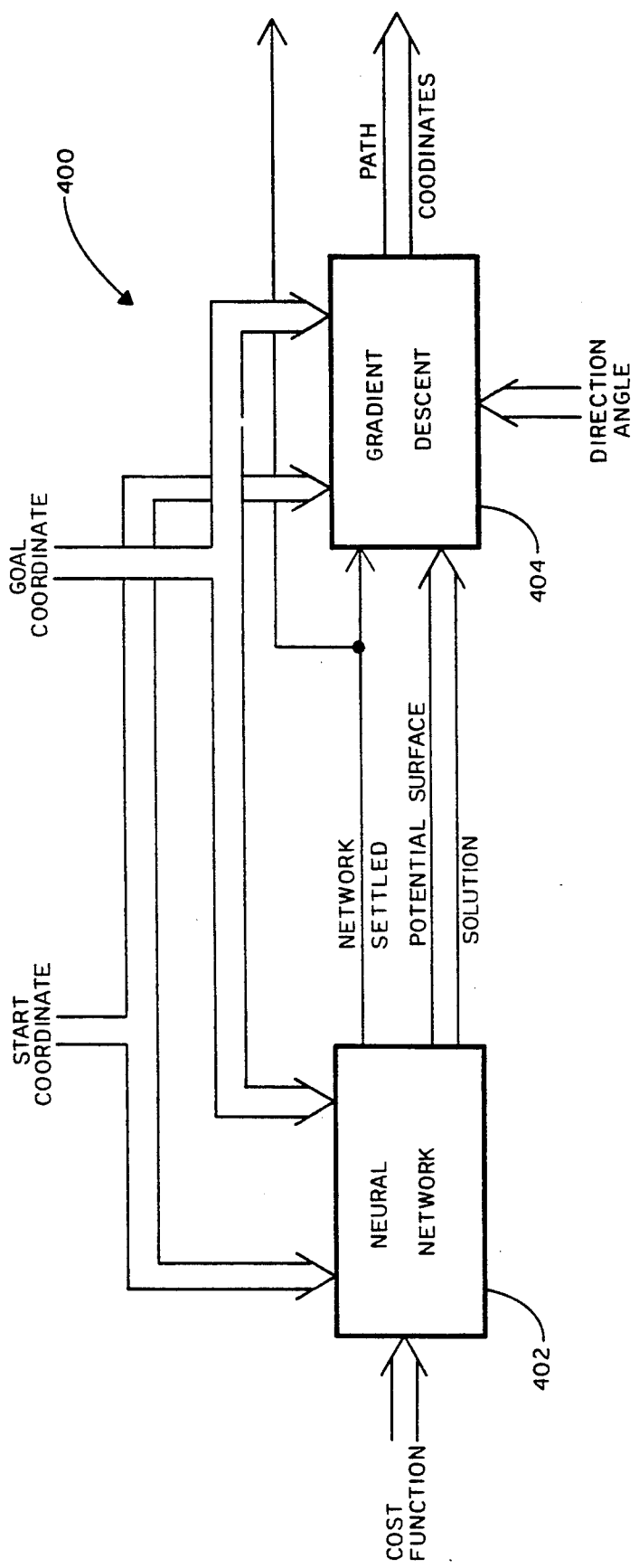
FIG. 11 is a functional block diagram illustrating an electrostatic model neural network path planner in accordance with the invention.

The implementation of these methodologies is provided by an architecture comprising an electrostatic model neural network path planner as shown in the illustration of FIG. 11. With reference to FIG. 11, the particular cost function to be performed is applied to the neural network shown as functional block diagram 402. Also applied as inputs to the neural network 402 are data representing the start coordinate and the goal coordinate for the implementation. The neural network can be characterized as providing outputs representing an indication of the settling of the network and a potential surface solution. For path planning, these outputs can be characterized as being applied as inputs to the gradient descent illustrated as functional block diagram 404 in FIG. 11. Again, start and goal coordinates are applied as inputs to the gradient descent, along with a direction angle. The output of the gradient descent comprises path coordinates representative of the optimal or near optimal path.

Figure 12:
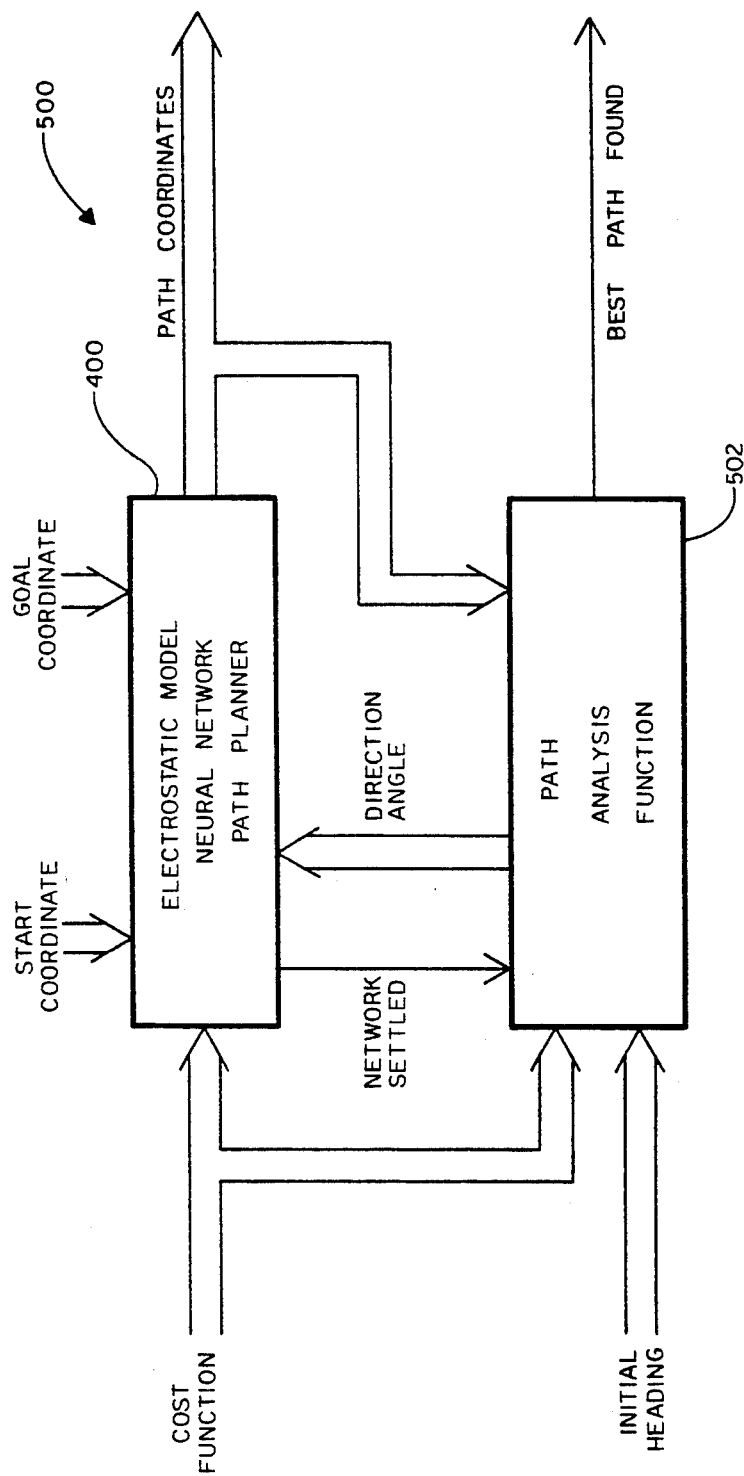
FIG. 12 is a functional block diagram illustrating an electrostatic model-based path generation system in accordance with the invention.

The electrostatic model-based path generation system can be functionally shown in its entirety as illustrated in FIG. 12. Therein, the electrostatic model neural network path planner 400 is illustrated with inputs of the start coordinate, goal coordinate and cost function. The cost function is also shown as an input to a path analysis function illustrated as functional block diagram 502. The initial direction for the path and the cost function are applied as inputs to the path analysis function 502. Also applied as inputs to the path analysis function 502 are signals representative of the settling of the network of the path planner 400, and the output path coordinates provided by the planner 400. In turn, the path analysis function 502 provides a direction angle as an input to the path planner 400 by performing a conventional iterative search (i.e. such as a binary search) over the direction angle to find the best path. The output of the path analysis function 502 comprises the optimal or near optimal path found by the generation system.

The foregoing has described particular network architectures in accordance with the invention. It should be noted that various details of the architectures described herein as exemplary embodiments in accordance with the invention are not meant to be exhaustive. It will be apparent to those skilled in the art of neural network technology and path planning design that other modifications and variations of the above-described illustrative embodiments of the invention can be effected without departing from the spirit and scope of the novel concepts of the invention.

The embodiments of the invention in which an exclusive property or privilege is claimed are defined as follows:

1. A circuit for implementing a five-point finite difference approximation numerical solution to a certain class of partial differential equations, with a selected set of equation functional parameters A, B, C, D, E and F which substantiate a particular partial differential equation, said functional parameters comprising coefficients of said particular partial differential equation and said circuit comprising:

an N plurality of gain-providing amplifiers comprising N/2 input amplifiers and N/2 output amplifiers, where each one of said input amplifiers includes an output connected to an input of one of said output amplifiers and is therefore characterized as associated with the connected output amplifier, and where an output of only a specific one of said output amplifiers is connected to one input of each of N/2−1 input amplifiers, and an output of each of the others of said output amplifiers is connected to an input of the input amplifier associated with said specific one of said output amplifiers; and conductance devices wherein each conductance value $w_i$ is related to five-point finite difference approximation template coefficients corresponding to the functional parameters A, B, C, D, E and F.

2. A circuit in accordance with claim 1, further comprising means for setting said five-point finite difference approximation template coefficients so as to solve an electrostatic field equation for a nonuniform conductive medium with a generalized function defining resistivity of said conductive medium.

3. A circuit in accordance with claim 2, where outputs of said circuit comprise a scalar potential field solution, having a gradient defining an infinite set of flux lines which are used to embody multiple paths as solutions to a path planning problem.

4. A circuit in accordance with claim 1, further comprising means for setting said five-point finite difference approximation template coefficients so as to solve a wave equation for a wave travelling in a non-homogenous medium, with a generalized function defining a refractive index of said medium.

* * * * *